(12) United States Patent
Jia et al.

(10) Patent No.: US 9,630,637 B2
(45) Date of Patent: Apr. 25, 2017

(54) COMPLEX NETWORK-BASED HIGH SPEED TRAIN SYSTEM SAFETY EVALUATION METHOD

(71) Applicant: BEIJING JIAOTONG UNIVERSITY, Beijing (CN)

(72) Inventors: Limin Jia, Beijing (CN); Yong Qin, Beijing (CN); Yanhui Wang, Beijing (CN); Shuai Lin, Beijing (CN); Hao Shi, Beijing (CN); Lifeng Bi, Beijing (CN); Lei Guo, Beijing (CN); Lijie Li, Beijing (CN); Man Li, Beijing (CN)

(73) Assignee: BEIJING JIAOTONG UNIVERSITY, Beijing (CN)

( * ) Notice: Subject to any disclaimer, the term of this patent is extended or adjusted under 35 U.S.C. 154(b) by 0 days.

(21) Appl. No.: 15/123,684

(22) PCT Filed: Nov. 27, 2015

(86) PCT No.: PCT/CN2015/095721
§ 371 (c)(1),
(2) Date: Sep. 6, 2016

(87) PCT Pub. No.: WO2016/091084
PCT Pub. Date: Jun. 16, 2016

(65) Prior Publication Data
US 2017/0015339 A1    Jan. 19, 2017

(30) Foreign Application Priority Data
Dec. 12, 2014 (CN) .......................... 2014 1 0768888

(51) Int. Cl.
*B61L 99/00* (2006.01)
*B61L 27/00* (2006.01)
(Continued)

(52) U.S. Cl.
CPC .............. *B61L 99/00* (2013.01); *G06F 17/50* (2013.01); *G06N 99/005* (2013.01); *H04L 67/12* (2013.01)

(58) Field of Classification Search
CPC .... B61L 99/00; B61L 27/00; G01M 17/0078; B60T 7/22; B60T 17/228
See application file for complete search history.

(56) References Cited

U.S. PATENT DOCUMENTS

| 6,212,954 | B1 * | 4/2001 | Albertini | ........... G01M 17/0078 73/12.01 |
|---|---|---|---|---|
| 9,283,945 | B1 * | 3/2016 | Kernwein | ............. B60T 17/228 |
| 2008/0189000 | A1 * | 8/2008 | Duong | ...................... B60T 7/22 701/20 |

FOREIGN PATENT DOCUMENTS

| CN | 102521432 A | 6/2012 |
|---|---|---|
| CN | 103955556 A | 7/2014 |

(Continued)

OTHER PUBLICATIONS

Xuemei Xiao et al., "Safety Assessment Model for Urban Rail Transit Network Operations Based on Complex Network and Entropy Theory", China Safety Science Journal Nov. 30, 2011 vol. 21, No. 11, ISSN: 1003-3033, see the whole docuenmt.

(Continued)

*Primary Examiner* — Yuri Kan
(74) *Attorney, Agent, or Firm* — Gokalp Bayramoglu

(57) ABSTRACT

The invention discloses a complex network-based high speed train system safety evaluation method. The method includes steps as follows: (1) constructing a network model of a physical structure of a high speed train system, and constructing a functional attribute degree of a node based on the network model; (2) extracting a functional attribute degree, a failure rate and mean time between failures of a component as an input quantity, conducting an SVM training (Continued)

using LIBSVM software; (3) conducting a weighted kNN-SVM judgment: an unclassifiable sample point is judged so as to obtain a safety level of the high speed train system. For a high speed train system having a complicated physical structure and operation conditions, the method can evaluate the degree of influences on system safety when a state of a component in the system changes. The experimental result shows that the algorithm has high accuracy and good practicality.

2 Claims, 4 Drawing Sheets

(51) Int. Cl.
  *B60T 7/22*   (2006.01)
  *G06F 17/50*  (2006.01)
  *G06N 99/00*  (2010.01)
  *H04L 29/08*  (2006.01)

(56) References Cited

FOREIGN PATENT DOCUMENTS

CN      104392071 A        3/2015
JP      2016002777 A  *    1/2016   ............. B61L 27/00

OTHER PUBLICATIONS

Yanhui Wang et al., "Design of the Simulation Platform for Safety Safeguard of High-Speed Trains Operation", China Railway Science Nov. 30, 2011 vol. 32, No. 6, ISSN: 1001-4632, see the whole document.

Haihong Zhu et al., "Research on Probabilistic Safety Assessment in Railway System Based on Bayes Networks", Computer Applications and Software Mar. 31, 2011 vol. 28, No. 3, ISSN:1000-386X, see the whole document.

* cited by examiner

COMPLEX NETWORK-BASED HIGH SPEED TRAIN SYSTEM SAFETY EVALUATION METHOD

TECHNICAL FIELD

The present invention relates to the technical field of high speed train system safety, and particularly relates to a complex network-based high speed train system safety evaluation method.

BACKGROUND

With development of high speed railways, safety issues of motor train units have also received extensive attention. For the study on safety of high speed rail trains, the "frequency-consequence" matrix method is more mature and is also a method used most widely. The frequency and the consequence in the matrix method are given according to experience of experts, which are more subjective.

A support vector machine (SVM) has a simple structure, a fast learning speed, good promotion performance, a unique minimal point during optimization solution and the like. The SVM is proposed in order to solve a two-classification problem; for a multi-classification problem, the SVM algorithm has one disadvantage: when a voting result is a tie, a safety level of a sample cannot be judged correctly. Weighted kNN (k neighbors) is re-judging a sample that cannot be classified accurately by the SVM, that is, for k categories, a category to which a sample point is close is judged, and the sample point is classified into the category.

Compared with the high speed rail safety evaluation method relatively common at present, that is, the matrix method, the weighted kNN-SVM-based safety evaluation method eliminates subjective factors in the matrix method from the position of a component in the system and reliability of the component, and thus has significant practical values and promotion significance for evaluation of high speed rail safety.

SUMMARY OF THE INVENTION

An objective of the present invention is to provide a complex network-based high speed train system safety evaluation method, including the following steps:

Step 1, constructing a network model G(V, E) of a high speed train according to a physical structure relationship of the high speed train, in which 1.1. components in a high speed train system are abstracted as nodes, that is, $V=\{v_i, v_2, \ldots, v_n\}$, in which V is a set of nodes, $v_i$ is a node in the high speed train system, and n is the number of the nodes in the high speed train system;

1.2. physical connection relationships between components are abstracted as connection sides, that is, $E=\{e_{12}, e_{13}, \ldots, e_{ij}\}$, $i,j \leq n$; in which E is a set of connection sides, and $e_{ij}$ is a connection side between the node i and the node j;

1.3. a functional attribute degree value $\tilde{d}_i$ of a node is calculated based on the network model of the high speed train: a functional attribute degree of the node i is $$\tilde{d}_i = \lambda_i * k_i \quad (1)$$

in which $\lambda_i$ is a failure rate of the node i, and $k_i$ is the degree of the node i in a complex network theory, that is, the number of sides connected with the node;

Step 2, by mean of analyzing operational fault data of the high speed train and combining a physical structure of the high speed train system, extracting the functional attribute degree value $\tilde{d}_i$, the failure rate $\lambda_i$ and Mean Time Between Failures (MTBF) of the component as a training sample set, to normalize the training sample set, in which 2.1. a calculation formula of the failure rate $\lambda_i$ is $$\lambda_i = \frac{\text{the number of times fault}}{\text{running kilometers}},$$

2.2. the MTBF is obtained from fault time recorded in the fault data, that is, $$MTBF_i = \frac{\sum \text{difference of fault time intervals}}{\text{the total number of times of fault} - 1},$$

2.3. samples are trained by using a SVM;

dividing safety levels of the samples by using a kNN-SVM; in which training samples in k safety levels are differentiated in pairs, and an optimal classification face is established for $$\frac{k(k-1)}{2}$$

SVM classifiers respectively, of which an expression is as follows:

$$f_{ij}(x) = \text{sgn}\left(\sum_{t=1}^{l} a_t y_t K(x_{ij}, x) + b_{ij}\right) \quad (2)$$

in which l is the number of samples in the ith safety level and the jth safety level, $K(x_{ij}, x)$ is a kernel function, x is a support vector, $a_t$ is a weight coefficient of the SVM, and $b_{ij}$ is an offset coefficient;

3.2. for a component to be tested, a safety level of the component is voted by combining the above two kinds of classifiers and using a voting method; the kind with the most votes is the safety level of the component;

3.3. as an operating environment of the high speed train system is complicated, it is easy to lead to a situation where classification is impossible when classification is carried out by using the SVM; therefore, a weighted kNN-based discrimination function is defined, and safety levels of the components are divided once again, which includes steps as follows:

in a training set $\{x_i, y_i\}, \ldots, \{x_n, y_n\}$, there is a total of one safety level, that is, $ca_1, ca_2, \ldots, ca_1$, a sample center of the ith safety level is $$c_i = \frac{1}{n_i}\sum_{j=1}^{n_i} x_j,$$

in which $n_i$ is the number of samples of the ith safety level, and the Euclidean distance from a component $x_j$ to the sample center of the ith safety level is $$d(x_j, o_i) = \sqrt{\sum_{m=1}^{3}(x_{jm} - c_{im})^2} \quad (3)$$

in which, in the formula: $x_{jm}$ is an mth feature attribute of a jth sample point in a test sample; and $c_{im}$ is an mth feature attribute in an ith-category sample center;

a distance discrimination function is defined as $$s_i(x) = \frac{\max(d(x,c)) - d(x,c_i)}{\max(d(x,c)) - \min(d(x,c))} \quad (4)$$

tightness of weighted kNN-based different-category samples is defined as $$\mu_i(x) = 1 - \frac{\sum_{j=1}^{m}\mu_i(x^{(j)})d(x, x^{(j)})}{\sum_{j=1}^{m}d(x, x^{(j)})} \quad (5)$$

in which m is the number of k neighbors; $u_i(x)$ is the tightness membership degree at which a test sample belongs to the ith training data; and $u_i(x^{(j)})$ is the membership degree at which the jth neighbor belongs to the ith safety level, that is, $$\mu_i(x^{(j)}) = \begin{cases} 1, & x \in ca_i \\ 0, & x \notin ca_i \end{cases};$$

and a classification discrimination function of the sample point is $$d_i(x) = s_i(x) \times \mu_i(x) \quad (6)$$

the tightness $d_i(x)$ at which a sample belongs to each safety level is calculated, and the category with the greatest value of $d_i(x)$ is a sample point prediction result.

Safety of the high speed train is divided into levels as follows according to Grade-one and Grade-two repair regulations and fault data records of a motor train unit:

| | |
|---|---|
| y = 1 | Safe: Not Affected, Continue Running |
| y = 5 | Safer: Temporary Repair and Odd Repair, Behind Schedule |
| y = 10 | Not Safe: Out of Operation and Not Out of the Rail Yard | that is, Safety Level 1 corresponding to y=1 is Safe, which includes running states of the train: Not Affected, Continue Running; Safety Level 2 corresponding to y=5 is Safer, which includes running states of the train: Temporary Repair and Odd Repair, Behind Schedule; Safety Level 3 corresponding to y=10 is Not Safe, which includes running states of the train: Out of Operation and Not Out of the Rail Yard.

Beneficial effects of the present invention are as follows: compared with the prior art, the method utilizes a complex network to extract a functional attribute degree of a node, extracts a failure rate, MTBF and other features according to fault data, and carries out training through a SVM; as the SVM has an unclassifiable problem for the multi-classification problem, importance of the position of the node in the system is taken into account; a sample point is checked by introducing a weighted kNN-SVM, influences of the component on safety of the high speed train system is obtained at last, a more accurate classification result can be obtained, judgment on safety of the high speed train is verified, and the verification result shows that the method has high practical values.

DETAILED DESCRIPTION OF THE INVENTION

The present invention provides a complex network-based high speed train system safety evaluation method, and the present invention is further described below with reference to the accompanying drawings.

Figure 1:
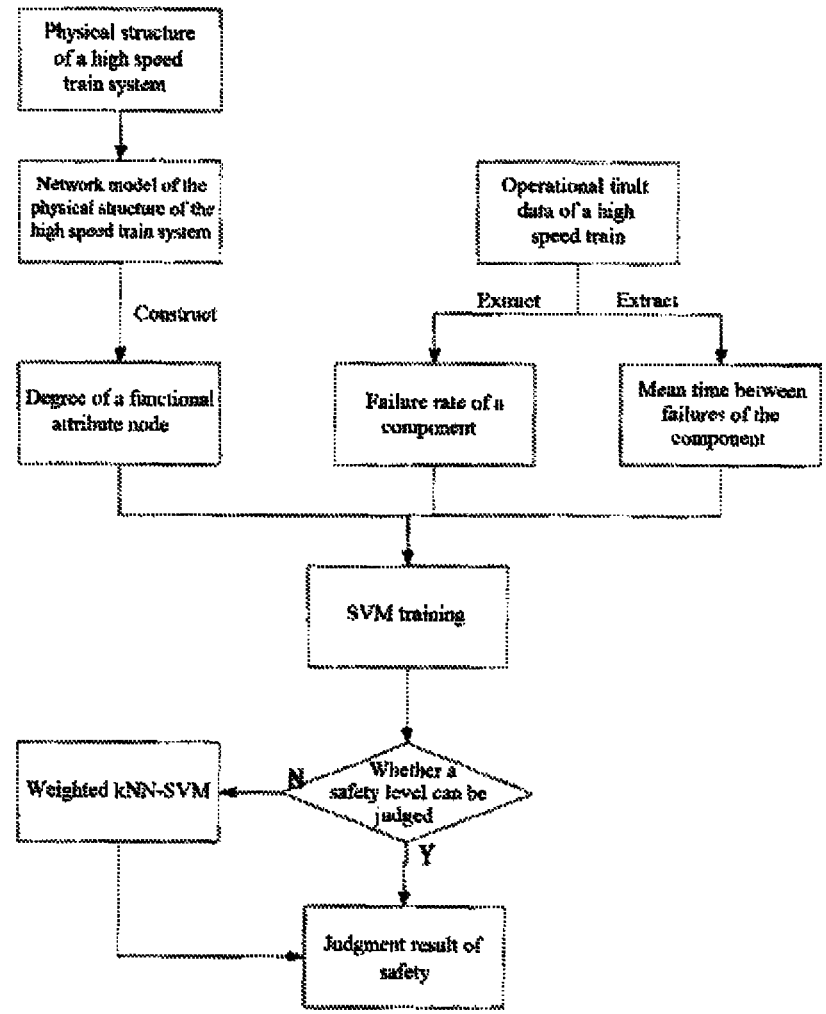
FIG. 1 is a flow chart of a high speed train safety evaluation method based on a complex network and a weighted kNN-SVM.
Figure 2:
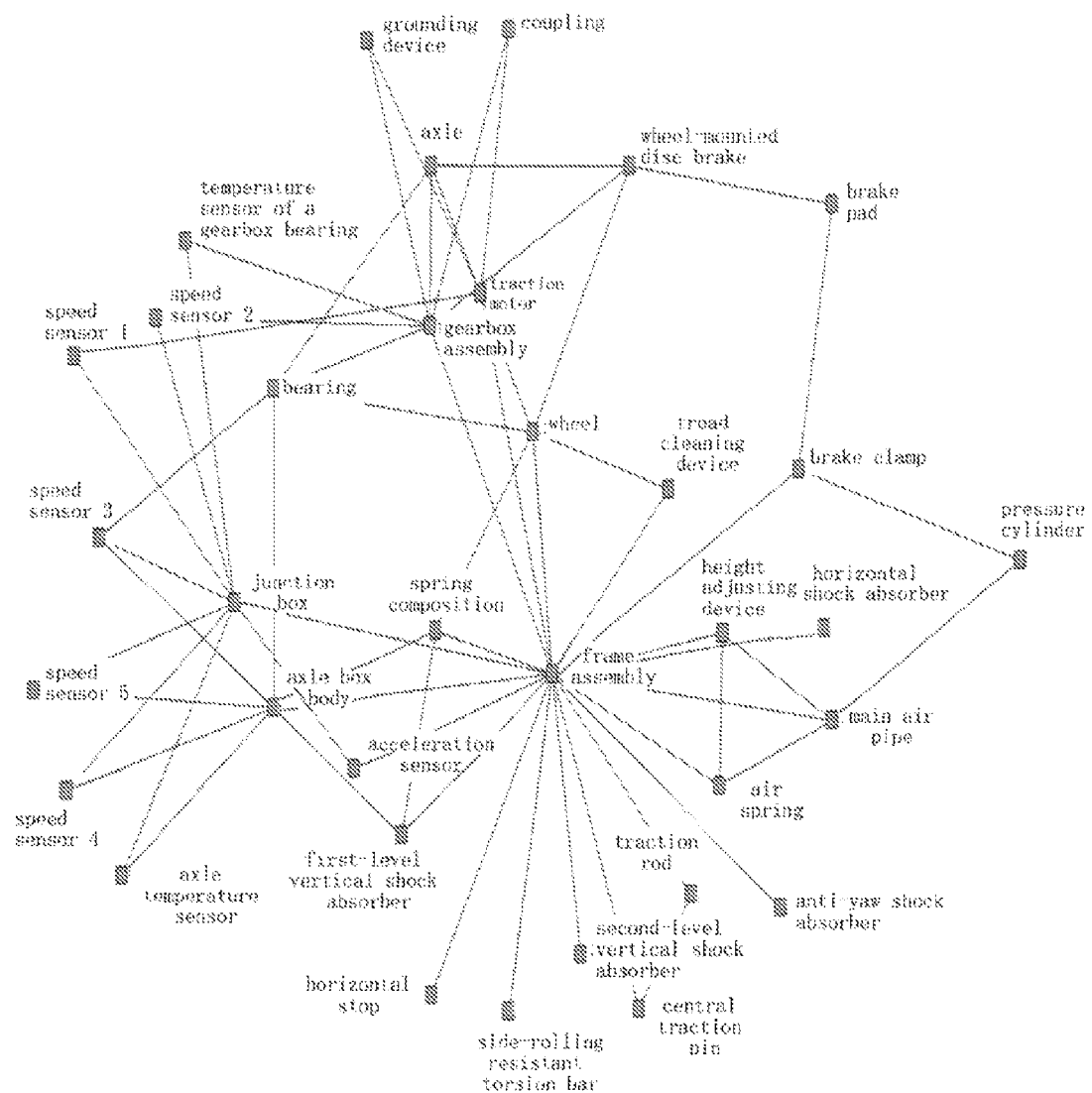
FIG. 2 illustrates a network model of a physical structure of a high speed train system.

FIG. 1 is a flow chart of steps of high speed train system safety evaluation. As shown in FIG. 1, at first, 33 components in a high speed train bogie system are extracted for functional structure characteristics of the bogie system (Step 1.1). Interaction relationships between the 33 components are abstracted based on a physical structure relationship of the bogie system (Step 1.2). The components are abstracted as nodes, and the interaction relationships between the components are abstracted as sides, to construct a network model of the high speed train bogie system as shown in FIG. 2.

A functional attribute degree $\tilde{d}_i = \lambda_i \cdot k_i$ of a node is selected as an input quantity from the perspective of the structure of the component based on the network model of the bogie (Step 1.3); a failure rate $\lambda_i$ and MTBF are selected as input quantities from the perspective of reliability attribute of the component in combination with operational fault data of the high speed train (Steps 2.1 and 2.2). For the same component in the high speed train bogie system, $\tilde{d}_i$, $\lambda_i$ and MTBF thereof in different operation kilometers are calculated respectively as a training set. For example, when the train runs to 2450990 kilometers, a gearbox assembly of a node 14 has $\tilde{d}_{14,1}$=0.027004, $\lambda_{14,1}$=0.013502, $MTBF_{14,1}$=150.2262. Safety levels of the high speed train are divided into three levels according to Grade-one and Grade-two repair regulations and fault data records of a motor train unit, that is, y=1 is Safe, y=5 is Safer, and y=10 is Not Safe.

Figure 3:
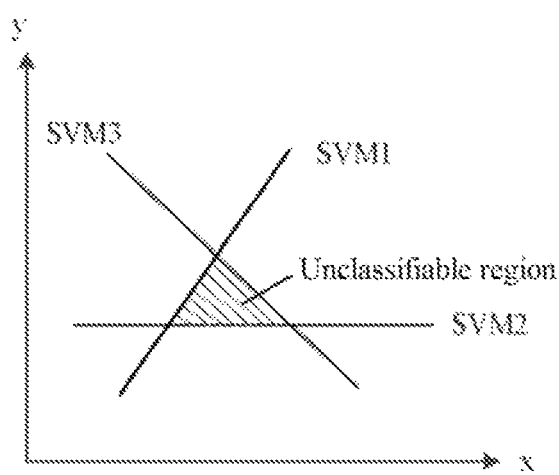
FIG. 3 illustrates a region where classification cannot be carried out with a SVM method.

By taking a component gearbox assembly as an example, three safety levels of the gearbox assembly, that is, a total of 90 groups of input quantities, are selected as a training set, SVM training is carried out by using an LIBSVM software package, and the accuracy of the calculation result is only 55.7778%. It is found through analysis that an operating environment of the high speed train is relatively complicated, a situation where classification is impossible often occurs when classification is carried out by using a SVM (as shown in FIG. 3), and thus it is necessary to use kNN to make a secondary judgment.

A sample center $$c_i = \frac{1}{n_i} \sum_{j=1}^{n_i} x_j \qquad (5)$$

of each of the three levels of the gearbox assembly that affect safety of the system and a distance $$d(x, o_i) = \sqrt{\sum_{m=1}^{3} (x_m - c_{im})^2}$$

from a sample to be tested x(0.02746, 0.01443, 200.75) to the three safety levels are calculated. Then, the following calculation is carried out step by step in the three safety levels: i=1, 2, 3

$$s_i(x) = \frac{\max(d(x,c)) - d(x, c_i)}{\max(d(x,c)) - \min(d(x,c))} \qquad (4)$$

$$\mu_i(x) = 1 - \frac{\sum_{j=1}^{k} \mu_i(x^{(j)}) d(x, x^{(j)})}{\sum_{j=1}^{k} d(x, x^{(j)})} \qquad (5)$$

Figure 4:
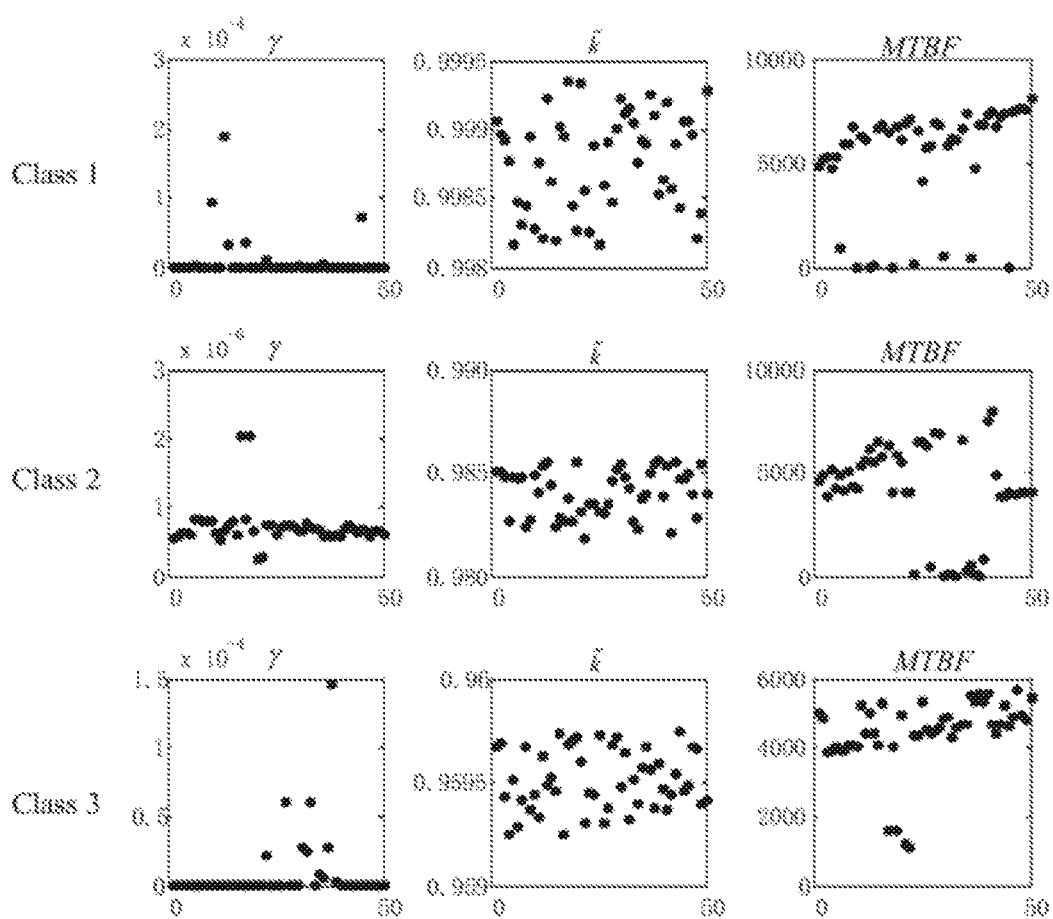
FIG. 4 illustrates a training set sample.

Finally, a classification discrimination function $g_i(x)=s_i(x) \times \mu_i(x)$ of each of the three safety levels is calculated, and it is obtained that a final classification result of a test sample (as shown in FIG. 4) x(0.02746, 0.01443, 200.75) is the safety level. It is obtained through a great number of experiments that accuracy of classification carried out by the component gearbox assembly by using a kNN-SVM is 96.6667%. A training set is established for each component in the high speed train bogie system, and it is found through experimental comparison that use of the kNN-SVM classification method significantly improves accuracy of evaluation on safety of the system, as shown in Table 2.

TABLE 2

Comparison between two methods

| Method | Average accuracy % |
|---|---|
| SVM | 73.3333 |
| kNN-SVM | 95.5556 |

The invention claimed is:

1. A complex network-based high speed train system safety evaluation method, comprising the following steps:
   Step 1, constructing a network model G(V, E) of a high speed train according to a physical structure relationship of the high speed train, wherein
   1.1. a plurality of components in a high speed train system are abstracted as nodes, that is, $V=\{v_1, v_2, \ldots, v_n\}$, wherein V is a set of nodes, $v_i$ is a node in the high speed train system, and n is a number of the nodes in the high speed train system;
   1.2. physical connection relationships between the plurality of components are abstracted as connection sides, that is, $E=\{e_{12}, e_{13}, \ldots, e_{ij}\}$, i,j≤n; wherein E is a set of connection sides, and $e_{ij}$ is a connection side between a node i and a node j;
   1.3. a functional attribute degree value $\tilde{d}_i$ of a node is calculated based on the network model of the high speed train: a functional attribute degree of the node i is $$\tilde{d}_i = \lambda_i * k_i \qquad (1)$$

wherein $\lambda_i$ is a failure rate of the node i, and $k_i$ is a degree of the node i in a complex network theory, that is, $k_i$ is a number of sides connected with the node i;
   Step 2, by mean of analyzing operational fault data of the high speed train and combining a physical structure of the high speed train system, extracting the functional attribute degree value $\tilde{d}_i$, the failure rate $\lambda_i$ and Mean Time Between Failures (MTBF) of one of the plurality of components as a training sample set, to normalize the training sample set, wherein
   2.1. a calculation formula of the failure rate $\lambda_i$ is, $$\lambda i = \frac{\text{a number of times of fault}}{\text{running kilometers}}$$

2.2. the MTBF is obtained from fault time recorded in the fault data, that is, $$MTBFi = \frac{\sum \text{difference of fault time intervals}}{\text{a total number of times of fault-1}}$$

2.3. samples are trained by using a support vector machine (SVM)
   Step 3, dividing safety levels of the samples by using a kNN-SVM; wherein
   3.1. training samples in k safety levels are differentiated in pairs, and an optimal classification face is established for $$\frac{k(k-1)}{2}$$

SVM classifiers respectively, of which an expression is as follows:

$$f_{ij}(x) = \text{sgn}\left(\sum_{t=1}^{l} a_t y_t K(x_{ij}, x) + b_{ij}\right) \qquad (2)$$

wherein l is a number of samples in a ith safety level and a jth safety level, $K(x_{ij}, x)$ is as kernel function, x is a support vector, $a_t$ is a weight coefficient of the SVM, and $b_{ij}$ is an offset coefficient;
   3.2. for one of the plurality of components to be tested, a safety level of the component is voted by combining the above two kinds of classifiers and using a voting method; the kind with the most votes is the safety level of the component;
   3.3. as an operating environment of the high speed train system is complicated, it is easy to lead to a situation where classification is impossible when classification is carried out by using the SVM; therefore, a weighted kNN-based discrimination function is defined, and safety levels of the plurality of components are divided once again, which comprises steps as follows:

in a training set $\{x_i, y_i\}, \ldots, \{x_n, y_n\}$, there is a total of one safety level, that is, $ca_1, ca_2, \ldots, ca_l$, a sample center of the ith safety level is $$c_i = \frac{1}{n_i}\sum_{j=1}^{n_i} x_j, \qquad (5)$$

wherein $n_i$ is a number of samples of the ith safety level, and the Euclidean distance from one of the plurality of components $x_j$ to the sample center of the ith safety level is $$d(x_j, o_i) = \sqrt{\sum_{m=1}^{3}(x_{jm}-c_{im})^2} \qquad (3)$$

wherein, in the formula: $x_{jm}$ is an mth feature attribute of a jth sample point in a test sample; and $c_{im}$ is an mth feature attribute in an ith-category sample center;
a distance discrimination function is defined as $$s_j(x) = \frac{\max(d(x, c)) - d(x, c_i)}{\max(d(x, c)) - \min(d(x, c))} \qquad (4)$$

tightness of weighted kNN-based different-category samples is defined as $$\mu_i(x) = 1 - \frac{\sum_{j=1}^{i}\mu_i(x^{(j)})d(x, x^{(j)})}{\sum_{j=1}^{k}d(x, x^{(j)})} \qquad (5)$$

wherein m is a number of k neighbors; $u_i(x)$ is a tightness membership degree at which a test sample belongs to the ith training data; and $u_i(x^{(j)})$ is the membership degree at which a jth neighbor belongs to the ith safety level, that is, $$\mu_i(x^{(j)}) = \begin{cases} 1, & x \in ca_i \\ 0, & x \notin ca_i \end{cases};$$

and a classification discrimination function of a sample point is $$d_i(x) = s_i(x) \times \mu_i(x) \qquad (6)$$

a tightness $d_i(x)$ at which a sample belongs to each safety level is calculated, and a category with a greatest value of $d_i(x)$ is the sample point prediction result.

2. The complex network-based high speed train system safety evaluation method according to claim 1, wherein safety of the high speed train is divided into levels as follows according to Grade-one and Grade-two repair regulations and fault data records of a motor train unit:

| | |
|---|---|
| y = 1 | Safe: Not Affected, Continue Running |
| y = 5 | Safer: Temporary Repair and Odd Repair, Behind Schedule |
| y = 10 | Not Safe: Out of Operation and Not Out of the Rail Yard | that is, Safety Level 1 corresponding to y=1 is Safe, which comprises running states of a train: Not Affected, Continue Running; Safety Level 2 corresponding to y=5 is Safer, which comprises running states of the train: Temporary Repair and Odd Repair, Behind Schedule; Safety Level 3 corresponding to y=10 is Not Safe, which comprises running states of the train: Out of Operation and Not Out of a Rail Yard.

* * * * *